US006822479B1

(12) United States Patent
Rosen

(10) Patent No.: US 6,822,479 B1
(45) Date of Patent: Nov. 23, 2004

(54) I/O BUFFER POWER UP SEQUENCE

(75) Inventor: Eitan Rosen, Abirim (IL)

(73) Assignee: Marvell Semiconductor Israel Ltd., Yokneam (IL)

(*) Notice: Subject to any disclaimer, the term of this patent is extended or adjusted under 35 U.S.C. 154(b) by 16 days.

(21) Appl. No.: 10/292,872

(22) Filed: Nov. 13, 2002

Related U.S. Application Data

(60) Provisional application No. 60/379,091, filed on May 9, 2002.

(51) Int. Cl.[7] ............................................. H03K 19/094
(52) U.S. Cl. ........................... 326/68; 326/81; 326/119; 326/121; 326/63; 327/333; 327/427
(58) Field of Search .................... 326/62, 63, 80–83, 326/112, 119, 121; 327/333, 427, 327

(56) References Cited

U.S. PATENT DOCUMENTS

| 5,737,612 A | 4/1998 | Ansel et al. |
| 6,237,103 B1 | 5/2001 | Lam et al. |
| 6,342,802 B1 | 1/2002 | Forehand |
| 6,614,283 B1 * | 9/2003 | Wright et al. ............... 327/333 |

* cited by examiner

*Primary Examiner*—Vibol Tan

(57) ABSTRACT

An intregrated circuit includes at least one I/O buffer. This buffer includes a first supply logic portion, connectable to a core voltage supply and an I/O voltage supply, and a second I/O buffer portion adapted to receive an activation signal from the first supply logic portion. The first supply logic portion is modified to act to prevent the output of an activation signal until the core voltage is supplied to the integrated circuit.

38 Claims, 2 Drawing Sheets

I/O BUFFER POWER UP SEQUENCE

The present application hereby claims priority under 35 U.S.C. §119 on U.S. Provisional patent application No. 60/379,091, filed May 9, 2002, the entire contents of which are hereby incorporated herein by reference.

FIELD OF THE INVENTION

The present invention is generally directed to an integrated circuit and method of operation thereof, and is more preferably directed to an input/output buffer of an integrated circuit and method of operation thereof. Even more preferably, it is directed to power up sequence indifferent I/O buffers.

BACKGROUND OF THE INVENTION

An integrated circuit typically receives supply voltage in the form of a core voltage (such as a voltage of about 1.5 volts, for example) for supplying core power to an integrated circuit chip, and an input/output (I/O) power voltage (such as a voltage of about 2.5 volts, for example) for supplying I/O power to various drivers and input/output functions of the integrated circuit including, but not limited to, input/output buffers of the integrated circuit. Based on timing of the I/O voltage and the core voltage to the integrated circuit, problems can occur.

A driver in one integrated circuit typically drives other integrated circuits. Under power up conditions, integrated circuits and circuits within the integrated circuits could be contending with one other. Such contention consumes power and could cause integrated circuits to be damaged and burned. If there are multiple drivers, the power supply of an entire mother board may short circuit or a fuse may burn.

A typical circuit for an I/O buffer of an integrated circuit is shown in FIG. 1. Such a circuit will cause contention when powered up, unless additional measures are taken. These measures will require additional circuits and signals.

The core power logic portion of the circuit typically includes a pair of non-complex inverters 106 and 112, each of which receives the input core voltage. The I/O power logic portion of the circuit typically includes a level shifter at the front end of an I/O buffer and a second input/output buffer portion 150 (such as an output buffer, for example), wherein the level shifter may include a pair of cross coupled inverters 120 and 130, and additional pull down transistors 108 and 114.

The inverters each receive the I/O supply voltage as indicated by elements 122 and 132, and each may include a P-channel transistor 124, 134, and an N-channel transistor 126 and 136. Preferably, the additional transistors 108 and 114 are also N-channel transistors.

The circuit is typically configured such that the output of the first P-channel transistor 124 connects to the input of the second P-channel transistor 134 and the second N-channel transistor 136, with the output of the second P-channel transistor 134 being connected to the input of the P-channel transistor 124 and the N-channel transistor 126. The output of the first P-channel transistor 124 also provides an input to the second I/O buffer portion 150, either providing activation of various drivers and circuits of the I/O buffer (in this exemplary case, in an active low condition), or providing a signal which does not activate the second I/O portion 150. Each of the N-channel transistors 114 and 108 are preferably grounded at elements 110 and 112; and each of the N-channel transistors 126 and 136 are preferably grounded at elements 128 and 138.

The circuits shown in FIG. 1 each include inverters with a P-channel transistor acting as a pull-up transistor and an N-channel transistor acting as a pull-down transistor. Due to the presence of the cross coupled inverters, one N-channel transistor is on and thus pulls down, and the other N-channel transistor is off, and thus the other P-channel transistor pulls up. There is some contention between the transistors until the second P-channel transistor 134 feeds its input to the first P-channel transistor 124 to essentially turn it off and allow that P-channel transistor 124 to give into the pull-down of the N-channel transistor 126. This momentary contention typically arises for a time on the order of a one inverter delay.

At a time when no core power is being supplied, however, both additional pull down N-channel transistors 114 and 108 are off, and thus both N-channel transistors 126 and 136 do not want to pull down. When the I/O voltage is then supplied at 122 and 132 in the absence of core power, none of the N-channel transistors want to pull down and the two cross coupled inverters 120 and 130 wake up in an unpredictable state. If the inverter 120 wakes up low and outputs an active low signal to the second I/O buffer portion 150, the output drivers of the second I/O buffer portion 150 wake up active and may begin to drive something. This I/O circuit could be connected to another I/O circuit which also may wake up in an active state and thus two integrated circuits may begin driving, and contention may result.

Similarly, if the I/O power is supplied before the core power in such a circuit, additional contention problems could occur. Thus, some suppliers have tried to advise that core power be supplied within 20 milliseconds, for example, of I/O power, in an attempt to limit any damage of contention. It is very difficult to meet such a demand, and such contention could violate component specifications.

SUMMARY OF THE INVENTION

The present invention, in one preferred embodiment, is directed to an integrated circuit including at least one I/O buffer. This buffer includes a first supply logic portion, connectable to a core voltage supply and an I/O voltage supply, and a second I/O buffer portion adapted to receive an activation signal from the first supply logic portion. The first supply logic portion is modified to prevent the output of the activation signal until the core voltage is supplied to the integrated circuit.

In such a preferred embodiment, the second 116 portion buffer will power up (from the 110 domain supply) in a "not active" state in the absence of core power. Thus, the integrated circuit can tolerate a long and potentially indefinite interval of time between the application of I/O power and the application of core power.

In another embodiment, the invention is directed to a method of operation of an integrated circuit including at least one input/output (I/O) buffer including, the buffer further including an input/output buffer portion adapted to become active upon receiving an activation signal and a supply logic portion connectable to a source adapted to supply a core voltage and a source adapted to supply an input/output (I/O) voltage. The method includes preventing the input/output buffer portion from being activated until the core voltage is supplied to the integrated circuit, and buffering information in the input/output buffer portion.

BRIEF DESCRIPTION OF THE DRAWINGS

The present invention will become more fully understood from the detailed description given below by way of exemplary embodiments of the present invention, and the accompanying drawings which are given by way of illustration only, and thus are not limited to the present invention, wherein like reference numerals represent like elements and wherein.

DETAILED DESCRIPTION OF THE PREFERRED EMBODIMENTS

An integrated circuit of an embodiment of the present invention includes at least one I/O buffer including both a first supply logic portion and a second I/O buffer portion, such as an output buffer for example. The first supply logic portion includes circuitry adapted to prevent output of an activation signal to the second I/O buffer portion until the core voltage is supplied to the integrated circuit. As such, the I/O buffer portion of the integrated circuit will wake up in a non-activated or non-enabled state. This occurs, for example, because until core voltage is supplied, the output of a cross coupled inverter will produce an output signal to the second I/O buffer portion which is a non-enabled or non-activation signal, instead of a random signal. As such the second I/O buffer portion, which can include the various buffers, drivers, etc. of the integrated circuit, will not be driving because an activation signal has not been provided. Similarly, when the core power is supplied, an activation signal can be provided.

In such a preferred embodiment the second I/O buffer will power up (from the I/O domain supply) in a "not active" state in the absence of core power. The result is an integrated circuit that can tolerate a long and potentially indefinite interval of time between the application of I/O power and the application of core power.

Figure 1:
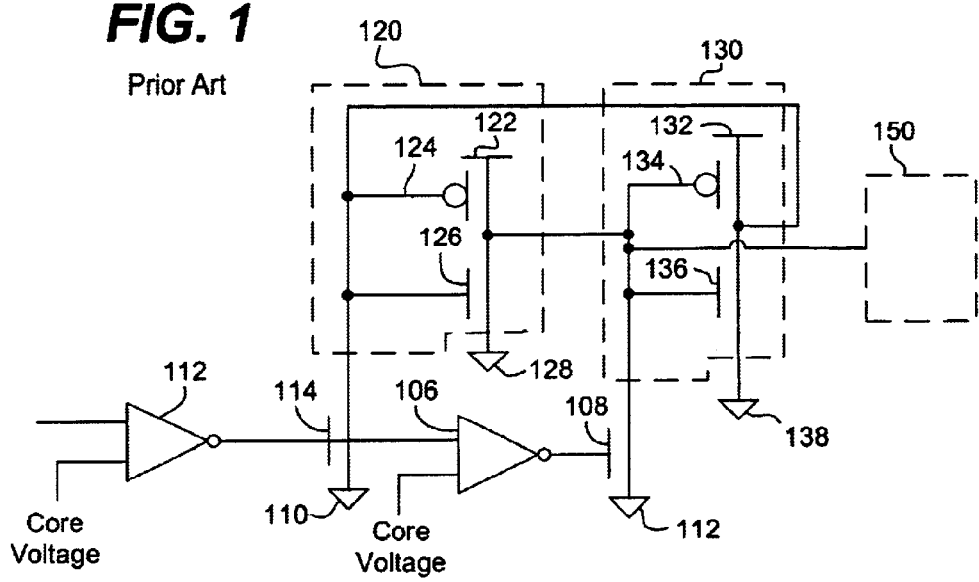
FIG. 1 illustrates an example of an integrated circuit including a known I/O buffer that will cause contention when powered up, unless additional measures are taken.
Figure 2:
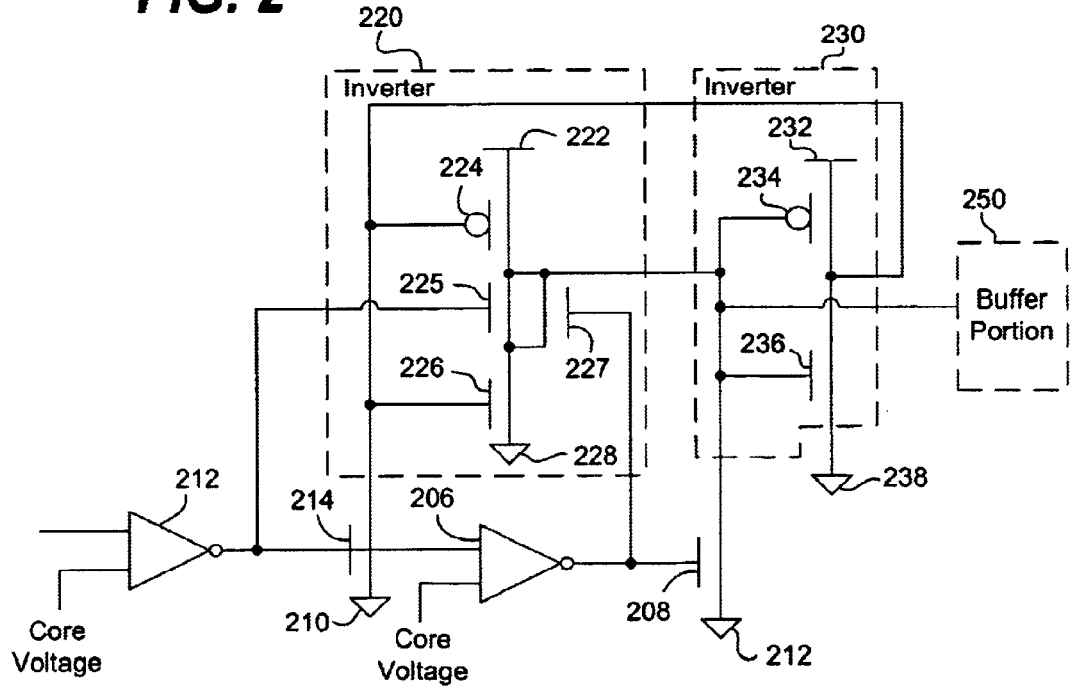
FIG. 2 illustrates one embodiment of an improved I/O buffer in an integrated circuit.

A first preferred embodiment of the present invention is shown in FIG. 2. In this figure, the core power logic again can include simple inverters 206 and 212, each receiving the core voltage when supplied, and a pair of pull down N-channel transistors 208 and 214. Each of the pull down N-channel transistors 208 and 214 is respectively coupled to one of two cross coupled invertors 220 and 230 which form a type of level shifter, adapted to relatively adjust a level of the core voltage and the I/O voltage. The second cross coupled inverter 230 of the level shifter includes a pull up P-channel transistor 234 and a pull down N-channel transistor 236 connected to ground 238, with an I/O supply voltage being received as designated by element 232. The output of the second cross coupled inverter 230 is input to a P-channel transistor 224 of the first inverter 220.

The first inverter 220 of the level shifter additionally includes not only includes a pull down N-channel transistor 226, but also a pair of N-channel transistors 225 and 227, coupled in parallel with each other, and coupled in series with the pull down N-channel transistor 226. This additional circuitry including the N-channel transistors 225 and 227 are adapted to be non-conducting when the core voltage is not supplied to inhibit output of the activation signal until the core voltage is supplied, as will be explained later. The inverter 220 is grounded as designated by element 228. The output of the inverter 220 is input to the inverter 230, and also provides an input to a second I/O buffer portion 250 (such as an output buffer, for example) which either activates or inhibits activation of the second I/O buffer portion 250 (thus acting as the enable input to the output buffer).

With the activation signal being active low, as is the case in the exemplary embodiment shown in FIG. 2, the pair of additional N-channel transistors 225 and 227 act to cripple the inverter 220 in a situation where core voltage has not been supplied, such that the N-channel transistor 226 of the inverter 220 is not capable of pulling down when the core voltage is not supplied. Thus, the N-channel transistors 225 and 227 do not conduct until the core voltage is supplied to the integrated circuit, to thereby prevent output of the activation signal until the core voltage is supplied. As such, the P-channel transistor 224 will pull up to a high voltage in such a situation, and will always output this high voltage to the second I/O buffer portion 250 until the core voltage is supplied to the integrated circuit.

Since the activation signal, in the present example, is an active low signal, the generation of such a high signal will prevent output of the activation signal to the I/O portion 250 until the core voltage is supplied to the integrated circuit. As such, this additional circuitry including a pair of parallel N-channel transistors 225 and 227 prevent output of the activation signal until the core voltage is supplied to thereby ensure that the I/O buffer portion 250 wakes up in an inactive mode.

As previously stated, the additional circuitry, including the two N-channel transistors 225 and 227 for example, are added to at least one of the cross coupled inverters 220. More preferably, they are added in parallel with one another, and in series with N-channel transistor 226. During normal operation of the circuit, when both the core voltage and I/O voltage are conducting, one of the N-channel transistors 225 and 227 is off, an the other is on. As such, they do not affect normal operation of the circuit. When the core voltage is supplied, one of the transistors 225 and 227 will conduct, to thereby permit output of the activation signal when the core voltage is supplied. However, if no core power is supplied, then neither N-channel transistors 225 and 227 conducts. As such, the P-channel transistor 224 of the first cross coupled inverter will always be high when the I/O voltage is supplied since none of the N-channel transistors connected thereto will be conducting and thus attempting to pull-down.

As such, the inverter 220 operates as if the two N-channel transistors 225 and 227 are not present in the circuit when a core voltage is supplied; and operates to create an output of a high signal (in an active low condition, for example) when a core voltage is not supplied. Thus, the additional circuitry including the two N-channel transistors 225 and 227 prevents output of the activation signal to the I/O buffer portion 250 until the core voltage is applied to the integrated circuit to thereby ensure that the I/O buffer portion wakes up in an inactive mode. Accordingly, contention between the circuits is avoided since the circuit provides for a predictive input to the second I/O buffer portion 250 and its associated circuits, drivers, etc. Therefore, the output of the left inverter 220 of FIG. 2 will wake up high when the core voltage is not supplied, and drivers, for example, in the second I/O buffer portion 250 of the integrated circuit will wake up in a disabled mode and thus will not be contending with other drivers of this or other integrated circuits.

Figure 3:
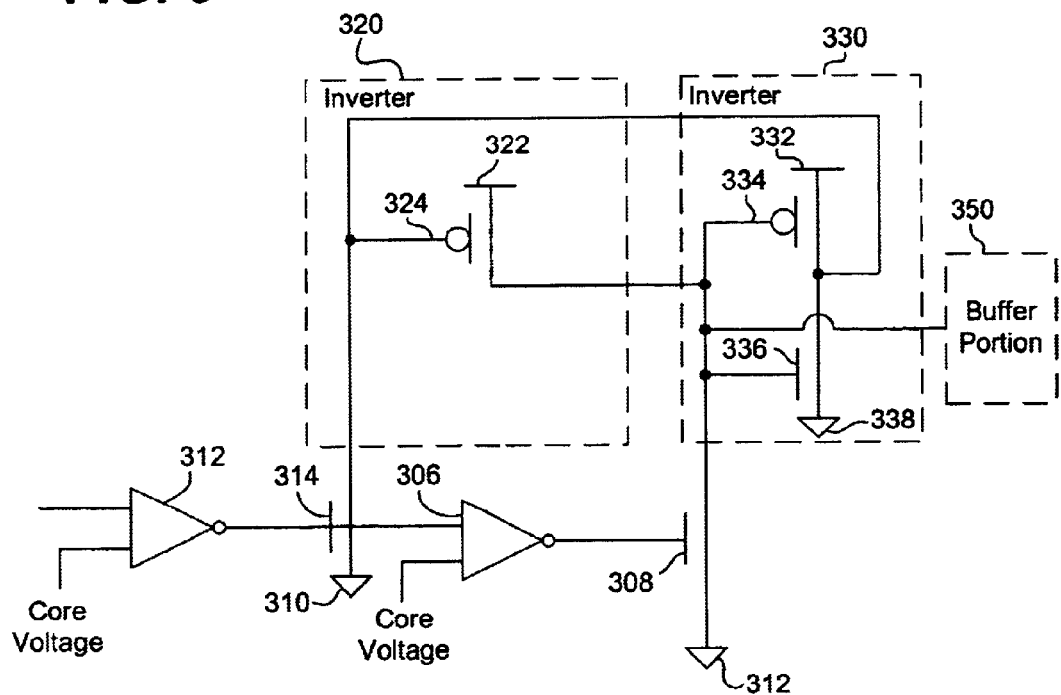
FIG. 3 illustrates another embodiment of an improved I/O buffer of an integrated circuit.

FIG. 3 illustrates another embodiment of the present invention. In this embodiment, the core power logic portion of the circuit still includes simple inverters 306 and 312, each receiving a core voltage when input, and pull down N-channel transistors 314 and 308. However, and although it includes cross coupled P-channel transistors 324 and 334 adapted to receive I/O voltage input at 322 and 332, the circuits 330 and 320 are distinct. The circuit 330 is an inverter, including both P-channel transistor 334 and N-channel transistor 336, coupled to ground 338. The circuit 320, however, which feeds an activation signal to the I/O buffer portion 350 (such as an output buffer for example), or prevents output of the activation signal by outputting a high (in this exemplary case) or non-activation signal, does not include a second pull down N-type transistor. Similar to the embodiment shown in FIG. 2 of the present application, however, the circuit 320 also prevents output of the activation signal to the second I/O buffer portion 350, until the core voltage is supplied to the integrated circuit to thereby ensure that the I/O buffer portion wakes up in an inactive mode. This will be explained as follows.

The circuit 320 of FIG. 3, which includes a single P-channel transistor 324, achieves the same effect as the inverter 220 of FIG. 2, which includes a pull down N-channel transistor, and two N-channel transistors 225 and 227, connected in parallel to one another and connected in series with the N-channel transistor 226. This is because, when core power is absent, the device 330, since it includes a pull down N-channel transistor 336, will output a low signal which will be fed into the P-channel transistor 324. The P-channel transistor 324 will thus output a high signal. When the output nodes of inverters 320, 330 ramp up together, as power ramps up, the imbalance of the devices (device 330 having a pull down N-channel transistor 336, and device 320 not having a pull down transistor) will cause the output node of device 330 to become lower than the output of 320. The regenerative effect (gain) of the circuit will make it switch: 320 down to zero, and 330 up to the supply voltage. The high signal output from P-channel transistor 324, in the active low circuit shown in FIG. 3 for example, ensures that the I/O buffer portion 350 wakes up in an inactive mode since output of an activation signal does not occur.

Essentially, the missing N-channel transistor of the circuit 320 does not need to do anything during normal operation of the device, and thus it is not missed. However, when core power is absent, the absence of this N-channel transistor essentially permits the circuit to inhibit output of the activation signal until the core voltage is supplied to the integrated circuit, to thereby ensure that the I/O buffer portion 350 wakes up in an inactive mode.

Other features and advantages of the present invention, as would be apparent to one of ordinary skill in the art, are included within the present invention and the present invention is not limited to the specific example circuits shown in FIGS. 2 and 3 of the present application. For example, FIGS. 2 and 3 include circuits for outputting an activation signal which is an active low. The present application is not limited to a circuit wherein the activation signal is an active low. Further, the present application is not limited to the specific circuit configuration shown in FIGS. 2 and 3.

In addition, other advantages of the present application which have not been discussed in detail are also included within the scope of each of the various embodiments of the present invention. For example, by utilizing the circuits of the embodiments of present invention in an integrated circuit, the integrated circuit can become hot swap compliant wherein in a device utilizing many integrated circuit cards, one card can be swapped in and out for another without the need to shut down power. Some pins of connectors of cards are typically longer than others, wherein the ground and I/O power pins are typically longer than data pins and core power pins. Since the I/O power pins are longer, utilizing the circuits shown in FIGS. 2 and 3 of the present invention, for example, the integrated circuits will wake up in an inactive mode since the core power will be supplied subsequent to the I/O power due to the longer pin configuration. As such, contention is avoided due to the fact that one to two milliseconds later, for example, the rest of the system can reset and all devices can wake up in an orderly systematic manner.

In another embodiment, the invention is directed to a method of operation of an integrated circuit including at least one input/output (I/O) buffer including, the buffer further including an input/output buffer portion adapted to become active upon receiving an activation signal and a supply logic portion connectable to a source adapted to supply a core voltage and a source adapted to supply an input/output (I/O) voltage. The method includes preventing the input/output buffer portion from being activated until the core voltage is supplied to the integrated circuit, and buffering information in the input/output buffer portion.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit, comprising:
   at least one input/output buffer including,
      a first supply logic portion, connectable to a source adapted to supply a core voltage and a source adapted to supply an input/output (I/O) voltage, and
      a second input/output buffer portion, adapted to receive an activation signal from the first supply logic portion, wherein the first supply logic portion includes circuitry adapted to be non-conducting when the core voltage is not supplied, to thereby prevent output of the activation signal until the core voltage is supplied to the integrated circuit.

2. The integrated circuit of claim 1, wherein the first supply logic portion includes a level shifter, adapted to relatively adjust a level of the core voltage and a level of the I/O voltage.

3. The integrated circuit of claim 2, wherein the level shifter includes the circuitry adapted to be non-conducting when the core voltage is not supplied to prevent output of the activation signal until the core voltage is supplied.

4. The integrated circuit of claim 1, wherein the circuitry includes at least two transistors, and wherein the at least two transistors do not conduct until the core voltage is supplied to the integrated circuit, to thereby prevent output of the activation signal until the core voltage is supplied.

5. The integrated circuit of claim 4, wherein at least one of the transistors is configured to conduct when the core voltage is supplied, to thereby permit output of the activation signal when the core voltage is supplied.

6. The integrated circuit of claim 2, wherein the circuitry includes at least two transistors, and wherein the at least two transistors do not conduct until the core voltage is supplied to the integrated circuit, to thereby prevent output of the activation signal until the core voltage is supplied.

7. The integrated circuit of claim 6, wherein at least one of the transistors is configured to conduct when the core voltage is supplied, to thereby permit output of the activation signal.

8. The integrated circuit of claim 1, wherein the first logic supply portion includes a pair of cross coupled inverters and a pair of transistors, at least two additional transistors being coupled in parallel across a transistor of at least one of the inverters, wherein the at least two additional transistors do not conduct until the core voltage is supplied to the integrated circuit, to thereby prevent output of the activation signal until the core voltage is supplied.

9. The integrated circuit of claim 2, wherein the level shifter includes a pair of cross coupled inverters and a pair of transistors, at least two additional transistors being coupled in parallel across a transistor of at least one of the inverters, wherein the at least two additional transistors do not conduct until the core voltage is supplied to the integrated circuit, to thereby prevent output of the activation signal until the core voltage is supplied.

10. The integrated circuit of claim 1, wherein the circuitry is adapted to prevent output of the activation signal until the core voltage is supplied to thereby ensure that the input/output buffer portion wakes up in a inactive mode.

11. An integrated circuit, comprising:
   at least one input/output buffer including,
      a first supply logic portion, connectable to a source adapted to supply a core voltage and a source adapted to supply an input/output (I/O) voltage, and
      a second input/output buffer portion, adapted to receive an activation signal from the supply logic, wherein the first supply logic portion includes at least two transistors which do not conduct until the core voltage is supplied to the integrated circuit, to thereby prevent output of the activation signal until the core voltage is supplied.

12. An integrated circuit, comprising:
   at least one input/output buffer including,
      a level shifter, connectable to a source adapted to supply a core voltage and a source adapted to supply an input/output (I/O) voltage, and
      a second input/output buffer portion, adapted to receive an activation signal from the level shifter when the core voltage is supplied, wherein the level shifter includes a pair of cross coupled inverters and a pair of transistors, at least two additional transistors being coupled in parallel across a transistor of at least one of the inverters, wherein the at least two additional transistors do not conduct until the core voltage is supplied to the integrated circuit, to thereby prevent output of the activation signal until the core voltage is supplied.

13. The integrated circuit of claim 12, wherein at least one of the additional transistors is configured to conduct when the core voltage is supplied, to thereby permit output of the activation signal when the core voltage is supplied.

14. The integrated circuit of claim 12, wherein the level shifter includes at least one inverter cross-coupled to a single transistor, and a pair of transistors, each coupled to one of the inverter and the single transistor.

15. An integrated circuit, comprising:
   at least one input/output (I/O) buffer means including,
      an input/output buffer portion means for buffering information, adapted to become active upon receiving an activation signal; and
      means for activating the input/output buffering portion means, connectable to a source adapted to supply a core voltage and a source adapted to supply an input/output (I/O) voltage, wherein the means for activating prevents the input/output buffer portion from being activated until the core voltage is supplied to the integrated circuit.

16. The integrated circuit of claim 15, wherein the means for activating includes a level shifting means for relatively adjusting a level of the core voltage and a level of the I/O voltage.

17. The integrated circuit of claim 16, wherein the level shifting means includes circuitry adapted to be non-conducting when the core voltage is not supplied to the integrated circuit, to prevent output of the activation signal until the core voltage is supplied to the integrated circuit.

18. The integrated circuit of claim 17, wherein the level shifting means includes at least two transistors, and wherein the at least two transistors do not conduct until the core voltage is supplied to the integrated circuit, to thereby prevent output of the activation signal until the core voltage is supplied to the integrated circuit.

19. The integrated circuit of claim 18, wherein at least one of the transistors is configured to conduct when the core voltage is supplied, to thereby permit output of the activation signal when the core voltage is supplied.

20. The integrated circuit of claim 16, wherein the level shifting means includes at least two transistors, and wherein the at least two transistors do not conduct until the core voltage is supplied to the integrated circuit, to thereby prevent output of the activation signal until the core voltage is supplied to the integrated circuit.

21. The integrated circuit of claim 20, wherein at least one of the transistors is configured to conduct when the core voltage is supplied, to thereby permit output of the activation signal.

22. The integrated circuit of claim 16, wherein the level shifting means includes at least a pair of cross coupled inverters and a pair of transistors, each coupled to an output of an inverter.

23. The integrated circuit of claim 22, wherein at least one of the cross-coupled inverters includes at least two additional transistors, and wherein the at least two additional transistors are coupled in parallel and do not conduct until the core voltage is supplied to the integrated circuit, to thereby prevent output of the activation signal until the core voltage is supplied to the integrated circuit.

24. The integrated circuit of claim 15, wherein the means for activating is for preventing output of the activation signal until the core voltage is supplied to the integrated circuit to thereby ensure that the input/output buffer portion wakes up in an inactive mode.

25. The integrated circuit of claim 15, wherein the means for activating includes at least one inverter cross-coupled to a single transistor, and a pair of transistors, each coupled to one of the inverter and the single transistor.

26. The integrated circuit of claim 16, wherein the level shifting means includes at least one inverter cross-coupled to a single transistor, and a pair of transistors, each coupled to one of the inverter and the single transistor.

27. The integrated circuit of claim 25, wherein the means for activating is for preventing output of the activation signal until the core voltage is supplied to the integrated circuit to thereby ensure that the input/output buffer portion wakes up in an inactive mode.

28. The integrated circuit of claim 26, wherein the means for activating is for preventing output of the activation signal until the core voltage is supplied to the integrated circuit to thereby ensure that the input/output buffer portion wakes up in an inactive mode.

29. An integrated circuit, comprising:
   at least one input/output buffer including,
      a level shifter, connectable to a source adapted to supply a core voltage and a source adapted to supply an input/output (I/O) voltage; and
      a second input/output buffer portion, adapted to receive an activation signal from the level shifter when the core voltage is supplied, wherein the level shifter includes at least one inverter cross-coupled to a single transistor, and a pair of transistors, each coupled to one of the inverter and the single transistor, wherein the single transistor does not output an activation signal to the second input/output buffer portion until the core voltage is supplied.

30. The integrated circuit of claim 29, wherein output of the activation signal is prevented until the core voltage is supplied to the integrated circuit, to thereby ensure that the input/output buffer portion wakes up in an inactive mode.

31. An integrated circuit, comprising:
   at least one input/output buffer including,
      a first supply logic portion, connectable to a source adapted to supply a core voltage and a source adapted to supply an input/output (I/O) voltage, and
      a second input/output buffer portion, adapted to receive an activation signal from the supply logic, wherein the first supply logic portion includes an inverter cross-coupled to a single transistor which does not output an activation signal to the second input/output buffer portion until the core voltage is supplied.

32. The integrated circuit of claim 31, wherein output of the activation signal is prevented until the core voltage is supplied to the integrated circuit, to thereby ensure that the second input/output buffer portion wakes up in an inactive mode.

33. A method of operation of an integrated circuit including at least one input/output (I/O) buffer including, the buffer further including an input/output buffer portion adapted to become active upon receiving an activation signal and a supply logic portion connectable to a source adapted to supply a core voltage and a source adapted to supply an input/output (I/O) voltage, the method comprising:

preventing the input/output buffer portion from being activated until the core voltage is supplied to the integrated circuit; and buffering information in the input/output buffer portion.

34. The method of claim 33, wherein the step of preventing output of the activation signal until the core voltage is supplied to the integrated circuit is performed by additional circuitry adapted to be non-conducting when the core voltage is not supplied to the integrated circuit.

35. The method of claim 33, wherein the step of preventing output of the activation signal until the core voltage is supplied to the integrated circuit is performed by at least two transistors, and wherein the at least two transistors do not conduct until the core voltage is supplied to the integrated circuit, to thereby prevent output of the activation signal until the core voltage is supplied to the integrated circuit.

36. The method of claim 35, wherein at least one of the transistors is configured to conduct when the core voltage is supplied, to thereby permit output of the activation signal when the core voltage is supplied.

37. The method of claim 33, wherein output of the activation signal is prevented until the core voltage is supplied to the integrated circuit to ensure that the input/output buffer portion wakes up in an inactive mode.

38. The method of claim 33, wherein the step of preventing output of the activation signal until the core voltage is supplied to the integrated circuit is performed by at least one inverter cross-coupled to a single transistor, and a pair of transistors, each coupled to one of the inverter and the single transistor.

* * * * *